United States Patent
Christensen et al.

(10) Patent No.: US 10,614,903 B2
(45) Date of Patent: Apr. 7, 2020

(54) TESTING NON-VOLATILE MEMORIES

(71) Applicant: International Business Machines Corporation, Armonk, NY (US)

(72) Inventors: Jeffrey W. Christensen, Katy, TX (US); Phillip E. Christensen, Houston, TX (US); Robert S. Miller, Friendswood, TX (US); Matthew S. Reuter, Columbus, OH (US); Antoine G. Sater, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/212,648

(22) Filed: Jul. 18, 2016

(65) Prior Publication Data

US 2018/0019022 A1    Jan. 18, 2018

(51) Int. Cl.
*G11C 29/38* (2006.01)
*G11C 29/36* (2006.01)
(Continued)

(52) U.S. Cl.
CPC .............. *G11C 29/38* (2013.01); *G11C 29/36* (2013.01); *G11C 29/44* (2013.01); *G11C 16/00* (2013.01)

(58) Field of Classification Search
CPC ......... G11C 29/38; G11C 29/44; G11C 29/36; G11C 29/56008; G11C 29/12; G11C 16/00
See application file for complete search history.

(56) References Cited

U.S. PATENT DOCUMENTS

| 6,075,724 A | 6/2000 | Li et al. |
| 7,350,105 B2 | 3/2008 | Aasheim et al. |

(Continued)

FOREIGN PATENT DOCUMENTS

WO    2013048451 A1    4/2013

OTHER PUBLICATIONS

Cai et al., "Error Analysis and Retention-Aware Error Management for NAND Flash Memory", Intel® Technology Journal, vol. 17, Issue 1, 2013, 25 pages.
(Continued)

*Primary Examiner* — Cynthia Britt
*Assistant Examiner* — Dipakkumar B Gandhi
(74) *Attorney, Agent, or Firm* — Steven F. McDaniel; Jose A. Medina-Cruz; William H. Harwell

(57) ABSTRACT

A computer-implemented method includes receiving probability distribution function (PDF) data corresponding to bit-error-rate (BER) data for each of a plurality of data blocks within a qualified set of NVRAMS, collecting non-exhaustive bit-error-rate data for each of the data blocks on a tested NVRAM to produce non-exhaustive test data for each of the data blocks, determining a plurality of stable data blocks on the tested NVRAM based on the non-exhaustive test data and the probability distribution function data for each of the data blocks, determining, from the non-exhaustive test data, an inferior data block for the stable data blocks on the tested NVRAM, collecting exhaustive bit-error-rate data on the inferior data block to produce exhaustive test data for the tested NVRAM, and routing the tested NVRAM according to the exhaustive test data. A corresponding computer program product and computer system are also disclosed herein.

19 Claims, 6 Drawing Sheets

(51) Int. Cl.
*G11C 29/44* (2006.01)
*G11C 29/54* (2006.01)
*G11C 16/00* (2006.01)

(56) References Cited

U.S. PATENT DOCUMENTS

| | | | |
|---|---|---|---|
| 7,788,205 B2 | 8/2010 | Chalasani et al. | |
| 8,151,137 B2 | 4/2012 | McKean et al. | |
| 8,214,190 B2 | 7/2012 | Joshi et al. | |
| 8,447,918 B2 | 5/2013 | Sprinkle et al. | |
| 8,806,106 B2 | 8/2014 | Goss et al. | |
| 8,910,020 B2 | 12/2014 | Frayer et al. | |
| 8,995,197 B1 | 3/2015 | Steiner et al. | |
| 9,047,214 B1 | 6/2015 | Northcott | |
| 2002/0036939 A1* | 3/2002 | Tsai | G11C 29/50 365/201 |
| 2003/0067697 A1* | 4/2003 | Weinstein | G11B 20/1816 360/31 |
| 2004/0088614 A1* | 5/2004 | Wu | G11C 29/88 714/718 |
| 2008/0082736 A1* | 4/2008 | Chow | G06F 12/0246 711/103 |
| 2008/0154820 A1* | 6/2008 | Kirshenbaum | G06K 9/6292 706/20 |
| 2008/0301393 A1* | 12/2008 | Kim | G06F 11/1435 711/170 |
| 2009/0013234 A1 | 1/2009 | Radke | |
| 2010/0058119 A1* | 3/2010 | Reid | G11C 16/349 714/49 |
| 2010/0131806 A1 | 5/2010 | Weingarten et al. | |
| 2012/0135548 A1* | 5/2012 | Hanzawa | G01R 31/31715 438/15 |
| 2012/0226963 A1* | 9/2012 | Bivens | G11C 29/42 714/773 |
| 2012/0239976 A1 | 9/2012 | Cometti et al. | |
| 2013/0003459 A1* | 1/2013 | Ulriksson | G11C 16/3418 365/185.09 |
| 2013/0024735 A1 | 1/2013 | Chung et al. | |
| 2013/0173972 A1 | 7/2013 | Kubo | |
| 2014/0006848 A1* | 1/2014 | Ramanujan | G11C 29/886 714/6.13 |
| 2014/0143618 A1* | 5/2014 | Griffin | G11C 16/349 714/718 |
| 2014/0237165 A1* | 8/2014 | Seo | G06F 12/0246 711/103 |
| 2014/0237298 A1 | 8/2014 | Pe'er | |
| 2014/0289559 A1* | 9/2014 | Hashimoto | G11C 29/08 714/27 |
| 2014/0347936 A1* | 11/2014 | Ghaly | G11C 11/56 365/185.18 |
| 2014/0380106 A1* | 12/2014 | Presman | G06F 11/073 714/718 |
| 2015/0026528 A1 | 1/2015 | d'Abreu et al. | |
| 2015/0177995 A1 | 6/2015 | Camp et al. | |
| 2016/0034206 A1 | 2/2016 | Ryan et al. | |
| 2016/0041873 A1 | 2/2016 | Davis et al. | |

OTHER PUBLICATIONS

Christensen et al., "Sorting Non-Volatile Memories", U.S. Appl. No. 15/008,843, filed Jan. 28, 2016, 26 pages.
Christensen et al., "Sorting Non-Volatile Memories", U.S. Appl. No. 15/066,178, filed Mar. 10, 2016, 22 pages.
Disclosed Anonymously et al., "Method for Code Transparency with Enhanced JTAG Secure Mode in Systems with External Flash", An IP.com Prior Art Database Technical Disclosure, IP.com No. 000227845, IP.com Electronic Publication: May 21, 2013, 5 pages.
Meza et al., "A Large-Scale Study of Flash Memory Failures in the Field", SIGMETRICS'15, Jun. 15-19, 2015, Portland, or, USA, ACM 978-1-4503-3486-0/15/06, 14 pages.
Odeh et al., "NAND Flash Architectures Reducing Write Amplification Through Multi-Write Codes", 978-1-4799-5671-5/14, © 2014 IEEE, 10 pages.

* cited by examiner

TESTING NON-VOLATILE MEMORIES

BACKGROUND OF THE INVENTION

The present invention relates generally to manufacturing quality and more particularly to manufacturing quality for electronic non-volatile random access memory devices such as flash memory chips, cards, and modules.

Non-volatile random access memories (NVRAMS) such as flash memories are subject to manufacturing defects as well as limited program/read/erase cycles. Detecting whether NVRAMS will fail early during their lifetime at the time of manufacture is a challenge and results in increased manufacturing costs and the unnecessary rejection of many usable devices.

SUMMARY

A computer-implemented method includes receiving probability distribution function (PDF) data corresponding to bit-error-rate (BER)) data for each of a plurality of data blocks within a qualified set of NVRAMS, collecting non-exhaustive bit-error-rate data for each of the data blocks on a tested NVRAM to produce non-exhaustive test data for each of the data blocks, determining a plurality of stable data blocks on the tested NVRAM based on the non-exhaustive test data and the probability distribution function data for each of the data blocks, determining, from the non-exhaustive test data, an inferior data block for the stable data blocks on the tested NVRAM, collecting exhaustive bit-error-rate data on the inferior data block to produce exhaustive test data for the tested NVRAM, and routing the tested NVRAM according to the exhaustive test data. A corresponding computer program product and computer system are also disclosed herein.

BRIEF DESCRIPTION OF THE DRAWINGS

FIG. 3B is a graph depicting one example of a block data bracketing in accordance with at least one embodiment of the present invention;

DETAILED DESCRIPTION

The embodiments disclosed herein recognize that the cost of exhaustive testing on NVRAMS is prohibitive and contributes to device wear and failure. The embodiments disclosed herein also recognize that the ability to predict future device failures may reduce the required testing burden at the time of manufacture. Furthermore, the frequency and costs associated with unnecessary rejections and post-manufacturing failures may also be reduced.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
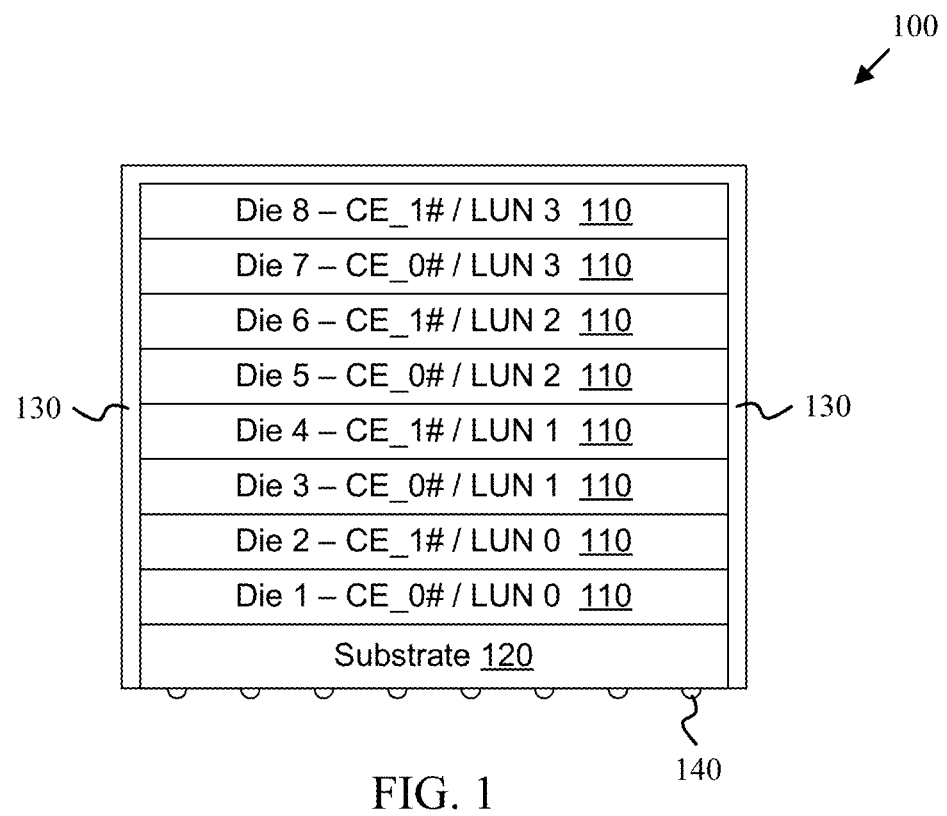
FIG. 1 is a schematic block diagram depicting one example of an NVRAM package in accordance with at least one embodiment of the present invention.

FIG. 1 is a schematic block diagram depicting one example of an NVRAM package 100 in accordance with at least one embodiment of the present invention. As depicted, the NVRAM package 100 includes a number of die 110 that are stacked and interconnected with each other and with a substrate 120. The depicted NVRAM package 100 also includes an encapsulant 130 that encapsulates and protects the NVRAM package 100. The depicted NVRAM package 100 also includes one or more interconnection elements 140 that enable mounting the NVRAM package 100 on a circuit board and interconnecting with other NVRAM packages 100 as well as other circuits.

The NVRAM package 100 and other forms of NVRAM may be subject to memory wear degradations within the individual memory cells on the die 110 in addition to packaging faults due to manufacturing issues. While many of the faults and some of the degradations may be easily detected with testing at the time of manufacture, others may not become unacceptable for a considerable length of time. Furthermore, some degradation or wear is expected and can be tolerated as long as the package can perform well over an expected lifetime after which the NVRAM packages 100, or the components or systems into which they are integrated, can be replaced as a whole.

The embodiments disclosed herein recognize that detecting degradation within individual NVRAM components within a computer storage system and replacing those components increases the maintenance costs associated with computer storage. The embodiments disclosed herein also recognize that the ability to predict, at the time of manufacture, NVRAM components that are at high risk of failure in the field can substantially reduce those maintenance costs. The embodiments disclosed herein also recognize that detecting failure metric patterns or trends may improve the ability to assess which NVRAM components are at high risk of failure in the field and/or reduce the number of testing cycles needed to achieve a sufficiently high level of confidence for the assessment.

Figure 2:
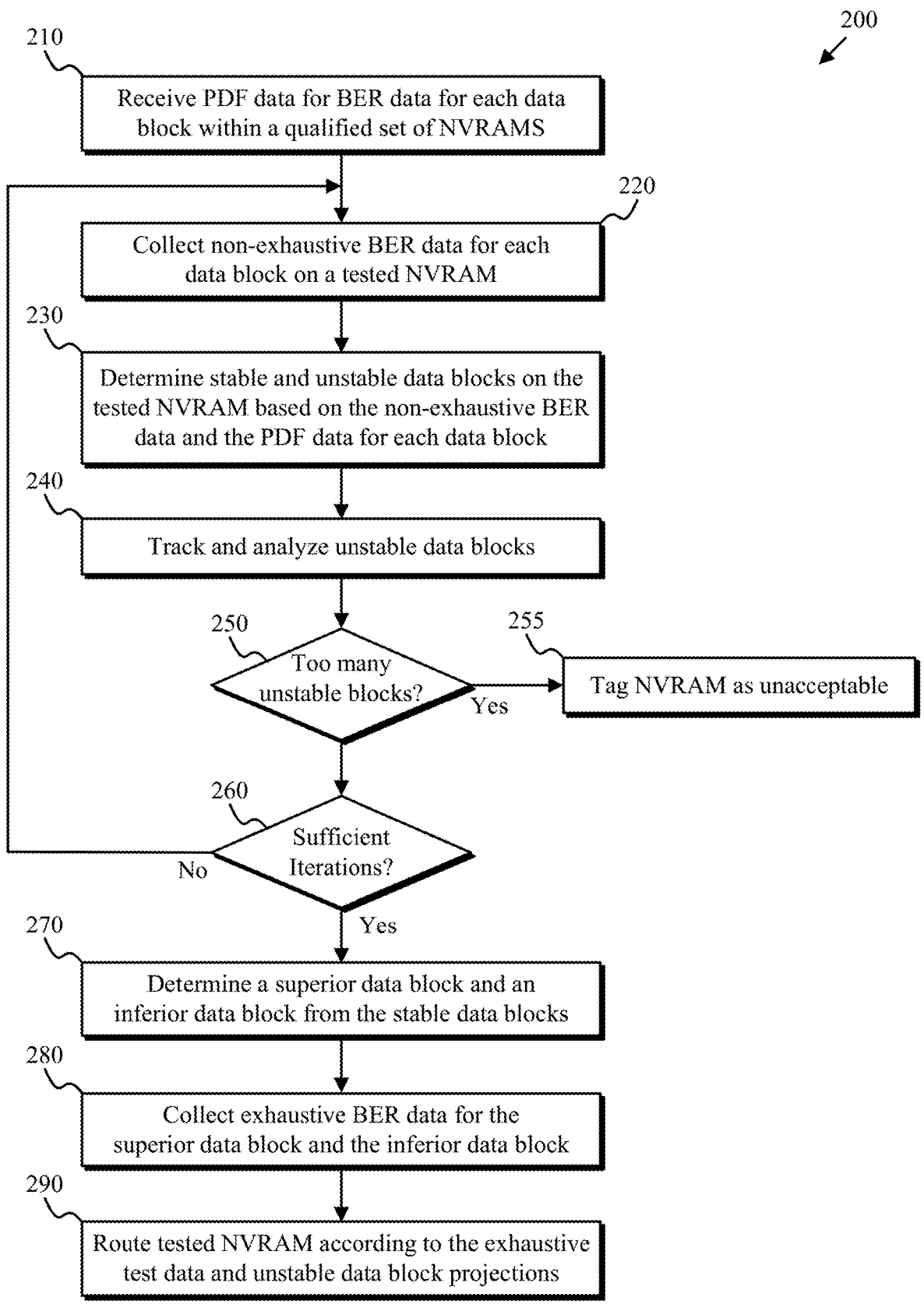
FIG. 2 is a flowchart depicting one example of a NVRAM testing method in accordance with at least one embodiment of the present invention.

FIG. 2 is a flowchart depicting one example of a NVRAM testing method 200 in accordance with at least one embodiment of the present invention. As depicted, the NVRAM testing method 200 includes receiving (210) qualified bit-error-rate (BER) data, collecting (220) non-exhaustive data for a tested NVRAM, determining (230) stable and unstable data blocks, tracking and analyzing (240) unstable data blocks, determining (250) whether the tested NVRAM has too many unstable data blocks, and tagging (255) the tested NVRAM as unacceptable. The NVRAM testing method 200 also includes determining (260) whether sufficient iterations have occurred, determining (270) superior and inferior data blocks, collecting (280) exhaustive data, and routing (290) the tested NVRAM. The NVRAM testing method 200 enables the detection of NVRAM components at the time of manufacture that have a high risk of failure in the field.

Receiving (210) qualified bit-error-rate (BER) data may include receiving BER data corresponding to a qualified set of NVRAMS. The BER data may be in the form of probability density function (PDF) metrics. For example, the PDF metrics may be a normally distributed set of data in which a chi-squared test is used to determine whether or not the data from a test block matches said normal distribution. The PDF metrics may correspond to BER data collected for a qualified set of NVRAMS. For example, the qualified set of NVRAMS may be NVRAMS that have passed a qualification test specified by the user. In one embodiment, the qualified set of NVRAMS are NVRAMS that have an overall bit-error-rate that is less than a selected threshold.

Collecting (220) non-exhaustive data for a tested NVRAM may include conducting a limited number of program/test/erase cycles on each data block in an NVRAM to produce non-exhaustive test data for a set of data blocks. The number of program/test/erase cycles may be sufficient to characterize the tested NVRAMs. The non-exhaustive test data may include BER data for the tested NVRAM. In some embodiments, data blocks that are known to be unstable are omitted from the set of tested data blocks. Redundant read operations may be conducted to determine a read failure rate and ascertain a write BER that is independent of the read BER.

Determining (230) stable and unstable data blocks may include evaluating data blocks on the tested NVRAM based on the non-exhaustive test data and the probability distribution function data for each data block. In some embodiments, data blocks that have a have a bit-error-rate that is less than or equal to a maximum stable block bit-error-rate are marked as stable data blocks. Data blocks with a higher bit-error-rate may be marked as unstable data blocks. The maximum stable block bit-error-rate may correspond to a selected percentile (e.g., $95^{th}$ percentile) determined from the probability distribution function data for the qualified set of NVRAMS.

Tracking and analyzing (240) unstable data blocks may include tracking the growth in unstable data blocks and producing unstable data block projections for the tested NVRAM. In some embodiments, unstable data blocks are tracked via a map and manufacturing defects and/or locations are identified from the map.

Determining (250) whether the tested NVRAM has too many unstable data blocks may include comparing a count of unstable data blocks to a selected threshold level. If the NVRAM has too many unstable data blocks the method continues by tagging (255) the tested NVRAM as unacceptable. Tagging (255) the tested NVRAM as unacceptable may include changing a status of the NVRAM in a tracking system. After the tagging operation 255, testing on the tested NVRAM is complete and the method exits. If the NVRAM does not have too many unstable data blocks the method continues by determining (260) whether sufficient iterations have occurred.

Determining (260) whether sufficient iterations have occurred may include tracking an iteration count for operations 220-240 and comparing the iteration count to a selected value. In one embodiment, two iterations are considered sufficient to show a growth trend in unstable blocks. One of skill in the art will appreciate that the number of iterations may be dependent on the number of program/test/erase cycles conducted with each iteration of operation 220.

Determining (270) superior and inferior data blocks may include comparing the non-exhaustive BER data for the various data blocks of the tested NVRAM and selecting one or more inferior data blocks and one or more superior data blocks. In one embodiment, stable data blocks with the worst and best bit-error-rates are selected as the inferior and superior data blocks respectively.

Collecting (280) exhaustive data may include exhaustively testing the inferior and superior data blocks to determine bit-error-rate trend data including end-of-life trends for the test NVRAM. By exhaustively testing only the inferior and superior data blocks, the life cycle behavior of the tested NVRAM as a whole may be determined (i.e., bracketed) without significant wear on the tested NVRAM as a whole.

Processing or routing (290) the tested NVRAM may include assigning the tested NVRAM to a group based on the exhaustive BER data previously collected in step 280. The group assignment may also be based on the non-exhaustive BER data collected in step 200. Examples of groups include a scrap group, a rework group, an acceptable quality group, and an exceptional quality group. The NVRAM may also be tagged or labeled (either automatically or via human assistance) to facilitate routing to a next appropriate phase of manufacturing or distribution. In some embodiments, an expected lifetime of the NVRAM (e.g., estimated program/erase cycles) is calculated from the exhaustive BER data and the NVRAM is placed into a group of NVRAMS with similar expected lifetimes.

Figure 3A:
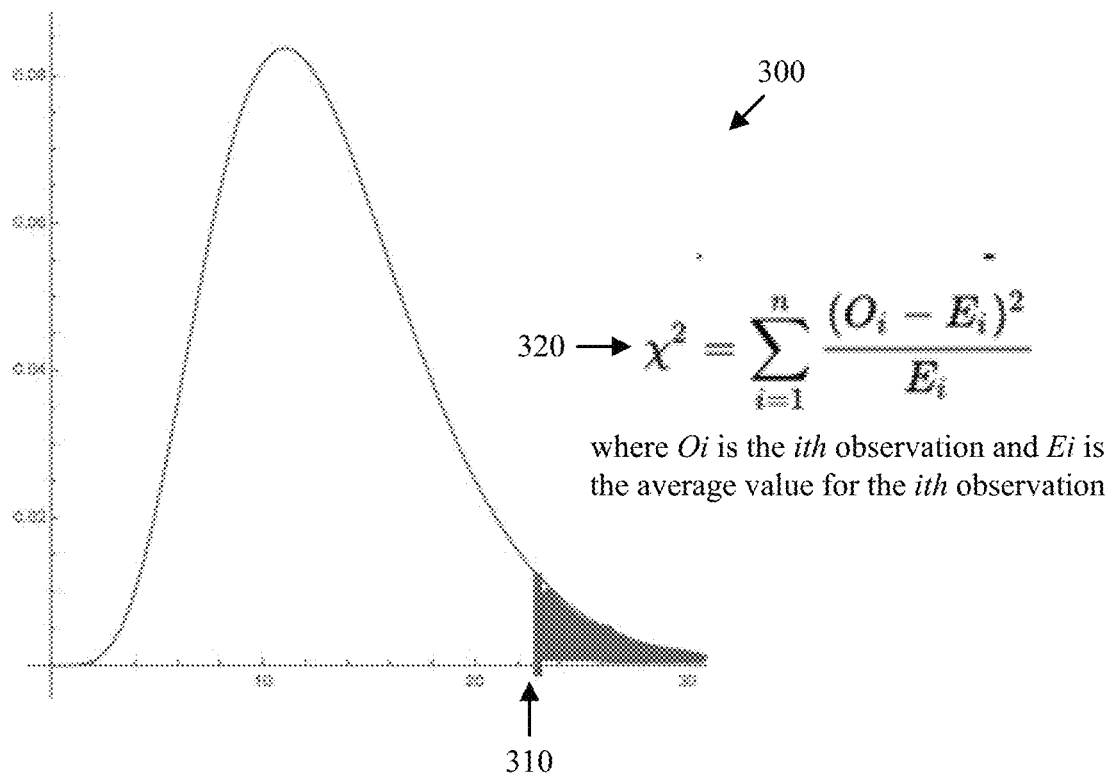
FIG. 3A is a graph depicting one example of a probability density function in accordance with at least one embodiment of the present invention.

FIG. 3A is a graph depicting one example of a probability density function (PDF) 300 in accordance with at least one embodiment of the present invention. The PDF 300 may correspond to qualified NVRAMS. In the depicted example, the horizontal axis corresponds to a bit-error-rate or bit-error-count and the vertical axis corresponds to a probability density. In some embodiments, a maximum stable block BER threshold 310 may be determined from the PDF by selecting a particular percentile for the bit-error-rate or bit-error-count. The portion of the area underneath the PDF that is to the left of the threshold 310 may correspond to the particular selected percentile (e.g., 95%). Blocks that yield a BER that is greater that the BER threshold 310 may be marked as unstable data blocks.

In certain embodiments, a chi-squared estimate 320 is used to determine whether N observed metrics for a data block (observed during N program/erase cycles) conform to the PDF of the qualified NVRAMS. If the value computed by the chi-squared estimation equation 320 is greater than a chi-squared value of a selected confidence level (e.g., 0.95) and N−1 degrees of freedom, the block is evaluated further to determine if it is a superior block or an unstable block.

Figure 3B:
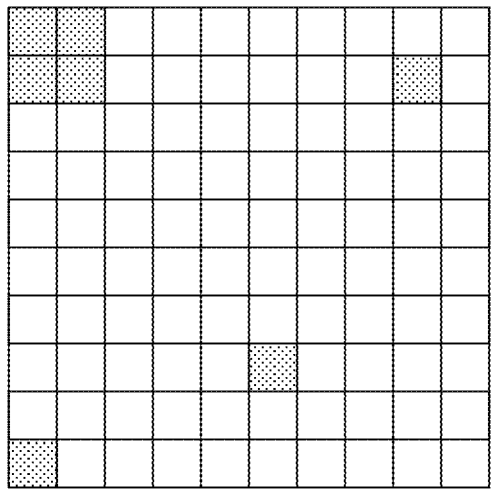
FIG. 3B is one example of a set of block maps 330 in accordance with at least one embodiment of the present invention.
Figure 3B:
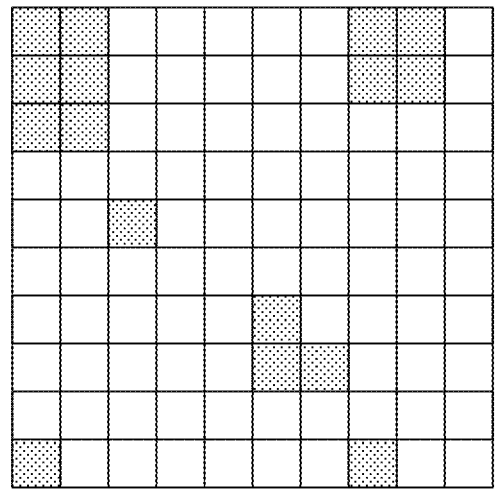
Figure 3B:
Figure 3B:

FIG. 3B is one example of a set of block maps 330 in accordance with at least one embodiment of the present invention. The depicted block maps 330 include a first iteration block map 330A and a second iteration block map 330B. The block maps 330, or the like, may be used to track and analyze the unstable blocks within a tested NVRAM. For example, analysis of the unstable blocks may reveal the location and type of manufacturing defects.

Figure 3C:
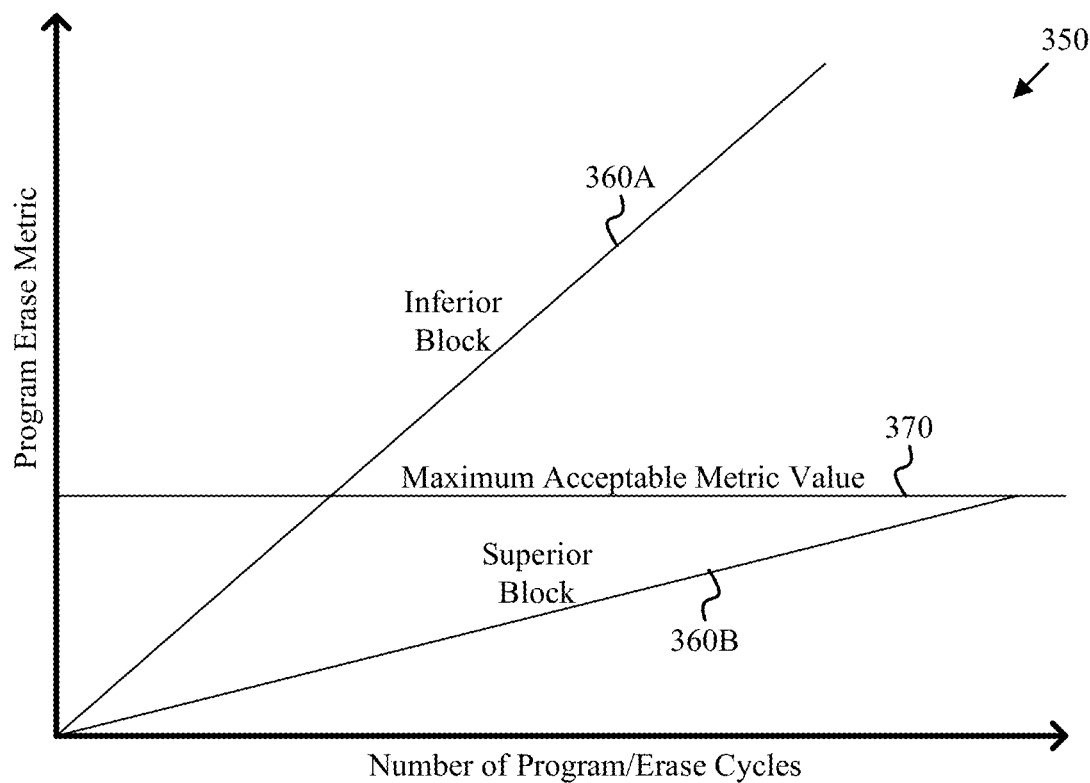
FIG. 3C is a graph depicting one conceptual example of lifetime bracketing in accordance with at least one embodiment of the present invention.

FIG. 3C is a graph depicting one conceptual example of lifetime bracketing 350 in accordance with at least one embodiment of the present invention. The depicted conceptual example includes an inferior block trend line 360A and a superior block trend line 360B that show the change in a program erase metric (e.g., number of unstable data blocks) as a function of the number of program erase cycles. For the purpose of illustration, the trend lines 360 are straight lines but actual data is unlikely to be so linear. A data block lifetime can be estimated by estimating the point at which the trend line 360 crosses a maximum acceptable metric value 370. By collecting exhaustive data for the inferior (e.g., worst case) block and the superior (e.g., best case) block the lifetime of a typical block and of the NVRAM as a whole can be estimated without conducting an exhaustive test on the NVRAM as a whole.

Figure 4:
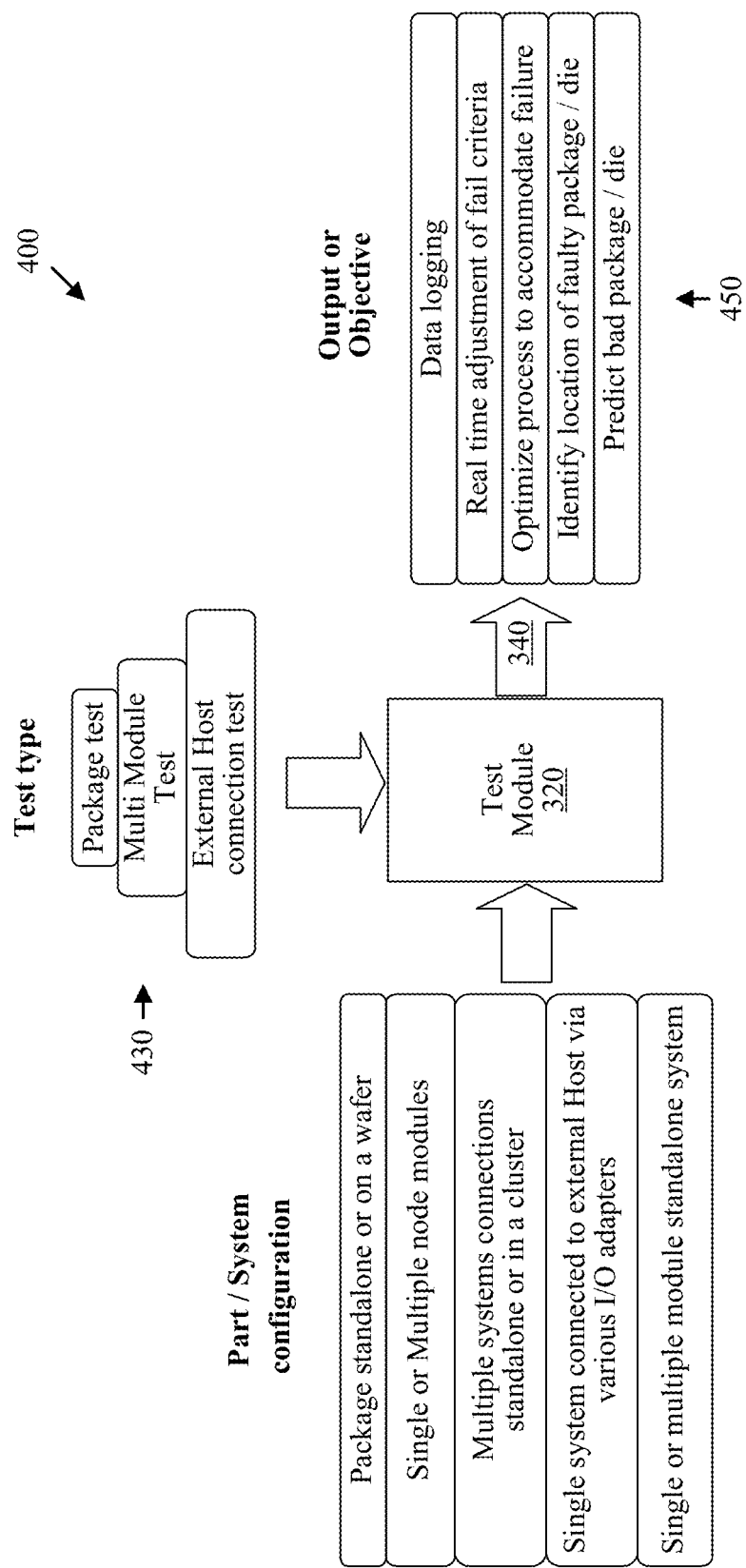
FIG. 4 is a workflow diagram depicting one example of a NVRAM testing environment in accordance with at least one embodiment of the present invention.

FIG. 4 is a workflow diagram depicting one example of a NVRAM testing environment 400 in accordance with at least one embodiment of the present invention. As depicted, various forms of NVRAMS 410 may be tested by a testing module 420 as directed by one or more test programs 430. The NVRAMS 410 may be tested previous to, or after, packaging and integration. Examples of the NVRAMS 410 include die, chips, wafers, modules, cards, and racks.

The test module 420 under direction of the test programs 430 may collect data 440 that is used for various purposes 450 including failure prediction, dynamic adjustment of separation metrics and thresholds, process optimization, identification of fault locations and the like.

Figure 5:
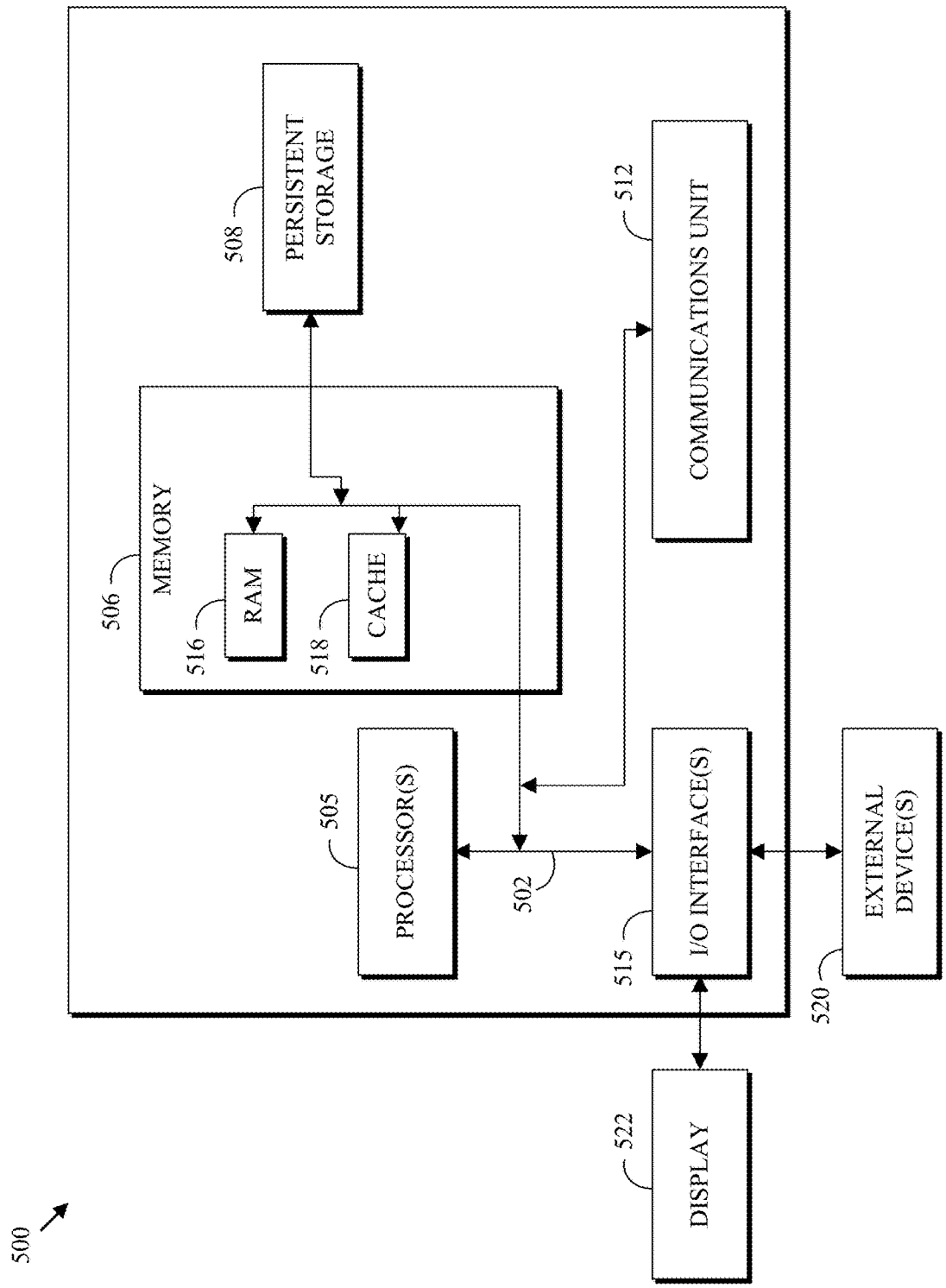
FIG. 5 is a block diagram depicting one example of a computing apparatus (i.e., computer) suitable to, or adaptable to, executing the methods disclosed herein.

FIG. 5 is a block diagram depicting one example of a computing apparatus (i.e., computer 500) suitable to, or adaptable to, executing the methods disclosed herein. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method, executed by one or more processors, for testing non-volatile random access memories (NVRAMS), the method comprising:
    receiving probability distribution function data corresponding to bit-error-rate data for each of a plurality of data blocks within a qualified set of NVRAMS;

collecting non-exhaustive bit-error-rate data for each of the plurality of data blocks on a tested NVRAM to produce non-exhaustive test data for each of the plurality of data blocks;

tracking a growth in unstable data blocks over a plurality of testing cycles in conjunction with collecting the non-exhaustive bit-error-rate data to produce unstable data block projections for the tested NVRAM;

determining whether a number of unstable data blocks of the unstable data block projections exceeds a selected threshold;

in response to determining that the number of unstable data blocks of the unstable data block projections does not exceed the selected threshold, determining a plurality of stable data blocks on the tested NVRAM based on whether the non-exhaustive test data matches the probability distribution function data for each of the plurality of data blocks according to a chi-squared test;

determining, from the non-exhaustive test data, an inferior data block for the plurality of stable data blocks on the tested NVRAM;

collecting exhaustive bit-error-rate data on the inferior data block to produce exhaustive test data for the tested NVRAM, wherein collecting exhaustive bit-error-rate data comprises end-of-life testing in conjunction with manufacturing the tested NVRAM and prior to integration of the tested NVRAM within a computing system; and processing the tested NVRAM according to the exhaustive test data, wherein the tested NVRAM is tagged and assigned to a group of a set of groups based on the collected exhaustive bit-error-rate data.

2. The method of claim 1, wherein the exhaustive test data comprises bit-error-rate trend data for the inferior data block.

3. The method of claim 1, further comprising determining, from the non-exhaustive test data, a superior data block for the plurality of stable data blocks on the tested NVRAM.

4. The method of claim 3, wherein the superior data block is a best data block and the inferior data block is a worst data block.

5. The method of claim 3, wherein the exhaustive test data comprises bit-error-rate data for the superior data block.

6. The method of claim 1, wherein tracking comprises mapping the unstable data blocks on the tested NVRAM.

7. The method of claim 1, wherein the stable data blocks have a bit-error-rate that is below a selected percentile.

8. The method of claim 1, wherein the qualified set of NVRAMS comprises NVRAMS that have passed a qualification test.

9. The method of claim 1, further comprising conducting redundant read operations to determine a read failure rate.

10. The method of claim 1, wherein the set of groups includes a scrap group, a rework group, an acceptable quality group, and an exceptional quality group.

11. A computer program product comprising:
one or more computer readable storage media, which are not transitory propagating signals per se, and program instructions stored on the one or more computer readable storage media, the program instructions comprising instructions executable by a computer to perform:
receiving probability distribution function data corresponding to bit-error-rate data for each of a plurality of data blocks within a qualified set of NVRAMS;

collecting non-exhaustive bit-error-rate data for each of the plurality of data blocks on a tested NVRAM to produce non-exhaustive test data for each of the plurality of data blocks;

tracking a growth in unstable data blocks over a plurality of testing cycles in conjunction with collecting the non-exhaustive bit-error-rate data to produce unstable data block projections for the tested NVRAM;

determining whether a number of unstable data blocks of the unstable data block projections exceeds a selected threshold;

in response to determining that the number of unstable data blocks of the unstable data block projections does not exceed the selected threshold, determining a plurality of stable data blocks on the tested NVRAM based on whether the non-exhaustive test data matches the probability distribution function data for each of the plurality of data blocks according to a chi-squared test;

determining, from the non-exhaustive test data, an inferior data block for the plurality of stable data blocks on the tested NVRAM;

collecting exhaustive bit-error-rate data on the inferior data block to produce exhaustive test data for the tested NVRAM, wherein collecting exhaustive bit-error-rate data comprises end-of-life testing in conjunction with manufacturing the tested NVRAM and prior to integration of the tested NVRAM within a computing system; and processing the tested NVRAM according to the exhaustive test data, wherein the tested NVRAM is tagged and assigned to a group of a set of groups based on the collected exhaustive bit-error-rate data.

12. The computer program product of claim 11, wherein the exhaustive test data comprises bit-error-rate trend data for the inferior data block.

13. The computer program product of claim 11, further comprising determining, from the non-exhaustive test data, a superior data block for the plurality of stable data blocks on the tested NVRAM.

14. The computer program product of claim 13, wherein the superior data block is a best data block and the inferior data block is a worst data block.

15. The computer program product of claim 13, wherein the exhaustive test data comprises bit-error-rate data for the superior data block.

16. The computer program product of claim 11, wherein tracking comprises mapping the unstable data blocks on the tested NVRAM.

17. The computer program product of claim 11, wherein the set of groups includes a scrap group, a rework group, an acceptable quality group, and an exceptional quality group.

18. A computer system comprising:
one or more computers;
one or more computer readable storage media, which are not transitory propagating signals per se, and program instructions stored on the one or more computer readable storage media for execution by at least one of the computers, the program instructions comprising instructions executable by a computer to perform:
receiving probability distribution function data corresponding to bit-error-rate data for each of a plurality of data blocks within a qualified set of NVRAMS;
collecting non-exhaustive bit-error-rate data for each of the plurality of data blocks on a tested NVRAM to produce non-exhaustive test data for each of the plurality of data blocks;

tracking a growth in unstable data blocks over a plurality of testing cycles in conjunction with collecting the non-exhaustive bit-error-rate data to produce unstable data block projections for the tested NVRAM;

determining whether a number of unstable data blocks of the unstable data block projections exceeds a selected threshold;

in response to determining that the number of unstable data blocks of the unstable data block projections does not exceed the selected threshold, determining a plurality of stable data blocks on the tested NVRAM based on whether the non-exhaustive test data matches the probability distribution function data for each of the plurality of data blocks according to a chi-squared test;

determining, from the non-exhaustive test data, an inferior data block for the plurality of stable data blocks on the tested NVRAM;

collecting exhaustive bit-error-rate data on the inferior data block to produce exhaustive test data for the tested NVRAM, wherein collecting exhaustive bit-error-rate data comprises end-of-life testing in conjunction with manufacturing the tested NVRAM and prior to integration of the tested NVRAM within a computing system; and processing the tested NVRAM according to the exhaustive test data, wherein the tested NVRAM is tagged and assigned to a group of a set of groups based on the collected exhaustive bit-error-rate data.

19. The computer system of claim 18, wherein the set of groups includes a scrap group, a rework group, an acceptable quality group, and an exceptional quality group.

* * * * *